United States Patent [19]

Seelbach et al.

[11] Patent Number: 4,570,240
[45] Date of Patent: Feb. 11, 1986

[54] AC TRANSIENT DRIVER FOR MEMORY CELLS

[75] Inventors: Walter C. Seelbach, Fountain Hills; Robert R. Marley, Phoenix, both of Ariz.

[73] Assignee: Motorola, Inc., Schaumburg, Ill.

[21] Appl. No.: 566,837

[22] Filed: Dec. 29, 1983

[51] Int. Cl.⁴ .................. G11C 7/00; G11C 8/00; G11C 11/00
[52] U.S. Cl. ................. 365/204; 365/242; 365/155
[58] Field of Search .......... 365/190, 203, 204, 189, 365/155, 156, 227, 242

[56] References Cited

U.S. PATENT DOCUMENTS

| | | | |
|---|---|---|---|
| 4,156,941 | 5/1979 | Homma et al. | 365/189 |
| 4,168,539 | 9/1979 | Anderson | 365/155 |
| 4,357,687 | 11/1982 | Rufford | 365/189 |
| 4,369,502 | 1/1983 | Isogai | 365/190 |
| 4,370,736 | 1/1983 | Takahashi | 365/190 |
| 4,477,885 | 10/1984 | Sharp | 365/242 |
| 4,488,268 | 12/1984 | Toyoda | 365/203 |

OTHER PUBLICATIONS

IBM Technical Disclosure Bulletin, "DI-Istor Speed-Up Word Drive With Resistor Word Bottom", by F. T. Blount et al., vol. 14, No. 6, Nov. 71, pp. 1734-1735.

Primary Examiner—Terrell W. Fears
Assistant Examiner—Guy Miller
Attorney, Agent, or Firm—William E. Koch

[57] ABSTRACT

A memory circuit is provided wherein the speed of the downward transition of the memory cell is increased. A plurality of memory cells are coupled between a select line and a current drain line. A first means is coupled to the select line for providing current to the plurality of memory cells and is responsive to a select signal having first and second states. A first PNP transistor has an emitter coupled to the current drain line for drawing any charge from the plurality of memory cells when the select signal transitions downward. A second means is coupled to the base of the first PNP transistor and is responsive to the select signal for setting the current level in said first PNP transistor. A second embodiment additionally includes a second PNP transistor having an emitter coupled to the select line and a collector coupled to said second supply voltage terminal for removing charge stored on the select line.

7 Claims, 4 Drawing Figures

— PRIOR ART —

— PRIOR ART —

AC TRANSIENT DRIVER FOR MEMORY CELLS

BACKGROUND OF THE INVENTION

1. Field of the Invention

This invention relates generally to bipolar memory cells and, more particularly, to bipolar memory cells having an AC transient driver for improving the downward transition of the row select line without substantially increasing power requirements.

2. Background Art

Memory cells are circuits wherein information may be stored in a low current stand-by mode and may be written or read in a higher current mode. A typical bipolar memory cell is illustrated in FIG. 1 and is also described in detail in the Detailed Description of the Preferred Embodiment. This previously known circuit comprises a plurality of memory cells wherein each typically includes a pair of multi-emitter transistors coupled between a row select line and a current drain line to function as a latch in a manner well known to those skilled in the art. Resistive loads are coupled between each transistor and the row select line. A row driver transistor is coupled between a first supply voltage terminal and the row select line and is responsive to a select signal. A current source transistor is coupled between the current drain line and a second supply voltage terminal.

A first and second discharge transistor are coupled between the row select line and the current drain line, respectively, and the second supply voltage terminal. A first diode is coupled between the row select line and the first discharge transistor and a second diode is coupled between the current drain line and the second discharge transistor.

Another previously known method similar to the above method includes logic circuitry for determining when the downward transition occurs, and which sends additional current to the NPN current source transistor 22 for a speedier discharge of the inherent capacitance. However, this method requires additional current and sophisticated timing which are extremely detrimental in memory cells, especially as the size of memory increases.

Thus, what is needed is an improved AC transient driven circuit for memory cells that provides an improved downward transition without a requirement for additional power.

SUMMARY OF THE INVENTION

Accordingly, it is an object of the present invention to provide an improved row line driver circuit which allows memory cells to be deselected with improved downward transition without an increased power requirement.

In carrying out the above and other objects of the invention in one form, there is provided a circuit comprising a plurality of memory cells coupled between a selection line and a current drain line. A means is coupled to the selection line for providing current to the plurality of memory cells. Another means is coupled to the current drain line for increasing the downward transition of the memory cells including a PNP transistor having an emitter coupled to the current drain line wherein the stand-by current drained from the plurality of memory cells is multiplied by the beta of the PNP transistor during transition.

The above and other objects, features, and advantages of the present invention will be better understood from the following detailed description taken in conjunction with the accompanying drawings.

DETAILED DESCRIPTION OF THE PREFERRED EMBODIMENT

Figure 1:
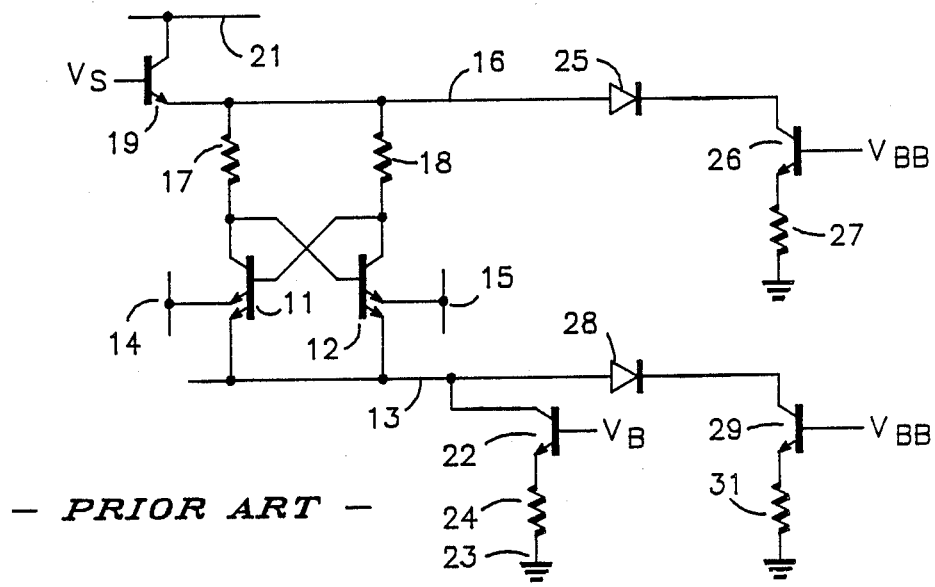
FIG. 1 is a schematic of a typical bipolar memory cell in a row selection configuration.

Referring to FIG. 1, a previously known circuit includes a pair of cross-coupled multi-emitter transistors 11, 12 which function as a latch. The bases of transistors 11, 12 are coupled to each others collector. A first emitter of each transistor 11, 12 is connected to a stand-by current drain line 13. A second emitter of transistor 11 is connected to bit line 14 and a second emitter of transistor 12 is connected to bit line 15. The collectors of transistors 11, 12 are coupled to row select line 16 by resistors 17, 18, respectively.

This memory cell is one of a plurality of memory cells that would be coupled between row select line 16 and current drain line 13. For instance, for a 16K memory, there could be 128 memory cells connected to each row select line 16.

An NPN row driver transistor 19 has an emitter connected to row select line 16, a collector connected to reference voltage line 21 and a base adapted to receive input signal $V_S$. An NPN current source transistor 22 has a collector connected to stand-by current drain line 13, an emitter coupled to reference voltage line 23 by resistor 24, and a base adapted to receive bias voltage $V_B$.

When input signal $V_S$ is positive, or transitioning upward, the NPN row driver transistor 19 provides current to row select line 16 charging all internal node capacitances and discharge line 13 to the selected voltage potential. Due to the $\beta$ multiplication of the NPN transistors, this positive transition occurs relatively rapidly.

When input signal $V_S$ is negative, or transitioning downward, NPN row driver transistor 19 no longer supplies current to row select line 16. Current source transistor 22 will drain capacitive charge from the memory cell.

However, inherent capacitances from the collector of the cross-coupled transistors 11, 12 and row select line 16 to ground and between the base-emitter of cross-coupled transistors 11, 12 causes this cell transition to be slow when discharged with the standby current source, transistor 22.

Previously known attempts to increase the speed of this downward transition include the addition of diode 25 coupled between row select line 16 and the collector of NPN accelerate discharge transistor 26. Transistor 26 has an emitter coupled to ground by resistor 27 and a base adapted to receive bias voltage $V_{BB}$. Diode 28 is coupled between current drain line 13 and the collector of NPN transistor 29. Transistor 29 has an emitter coupled to ground by resistor 31 and a base adapted to receive bias voltage $V_{BB}$. As the voltage on row select line 16 and current drain line 13 transitions downward, transistors 26, 29 accelerate this downward transition by helping to remove the stored charge from the inherent cell capacitances.

The currents in transistors 26, 29 are many times the current in each individual memory cell. These currents are diode logic steered by circuitry not shown to the appropriate row to aid in its discharge until another row is selected and exceeds the falling deselected row's voltage. The rate of fall decreases at cell switchover as the rising cell picks up the current resulting in slow full deselect of the cell.

Figure 2:
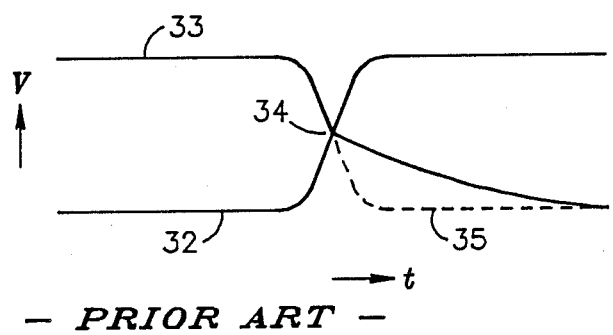
FIG. 2 is a graph illustrating selection and deselection of the memory cell of FIG. 1.

Referring to FIG. 2, waveform 32 illustrates an upper transition for the voltage on row select line 16 for a positive transitioning select signal $V_S$ to the base of transistor 19. Waveform 33 illustrates a downward transition for the voltage on row select line 16 for a negative transitioning select signal $V_S$ to the base of transistor 19. At the cross-over point 34 of waveforms 32, 33, the downward rate of waveform 33 tapers off dramatically. The dotted waveform 35 represents a more desirable path.

Figure 3:
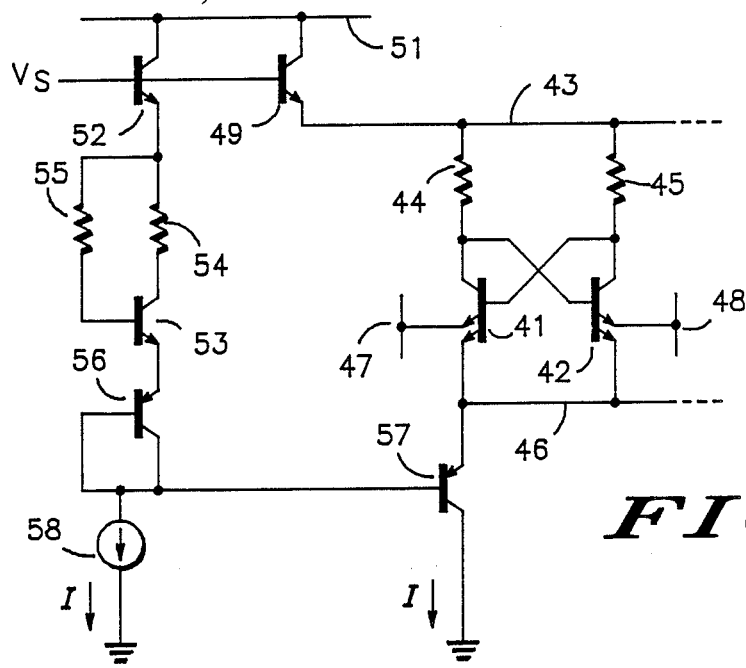
FIG. 3 is a schematic of a first embodiment of the present invention.

Referring to FIG. 3, the preferred embodiment of the present invention includes a pair of cross-coupled multi-emitter transistors 41, 42 that have collectors cross-coupled to each others base and coupled to row select line 43 by resistors 44, 45, respectively. A first emitter of each transistor 41, 42 is connected to stand-by current drain line 46. A second emitter of transistor 41 is connected to bit line 47 and a second emitter of transistor 42 is connected to bit line 48.

Resistors 44, 45 are only by way of example. Diodes may be substituted for resistors 44, 45 or a resistor and diode may be placed in parallel. Further alternatives would include transistors coupled between the collectors of transistors 41, 42 and row select line 43.

As in the previously described memory array of FIG. 1, a plurality of memory cells would actually be coupled between row select line 43 and current drain line 46. This plurality of memory cells is reflected by dotted lines for row select line 43 and current drain line 46.

NPN row driver transistor 49 has an emitter coupled to row select line 43, a collector connected to reference voltage line 51, and a base adapted to receive select signal $V_S$. NPN transistor 52 has its collector connected to reference voltage line 51 and its base adapted to receive select signal $V_S$. The emitter of transistor 52 is coupled to the collector of transistor 53 by resistor 54 and to the base of transistor 53 by resistor 55. The emitter of transistor 53 is connected to the emitter of PNP transistor 56. Both the base and collector of transistor 56 are connected to the base of PNP transistor 57 and are coupled to ground by current source 58. The collector of transistor 57 is also connected to ground. Transistor 53 and resistors 54, 55 comprise a half cell and will draw a substantially similar current to that of the memory cell comprising transistors 41, 42 and resistors 44, 45. The half cell and memory cell may be of any type. The main requirement is that their currents are substantially similar. Transistors 56 and 57 are matched and will draw a substantially similar current. Current source 58 sets the current level in all devices.

When a negative, or downward transition, select signal $V_S$ is applied to the bases of transistors 49, 52, transistors 49, 52 will turn off. Current source 58 will pull down transistors 56, 57. Transistor 57 will pull down the row memory cells with current I multiplied by $\beta$.

Figure 4:
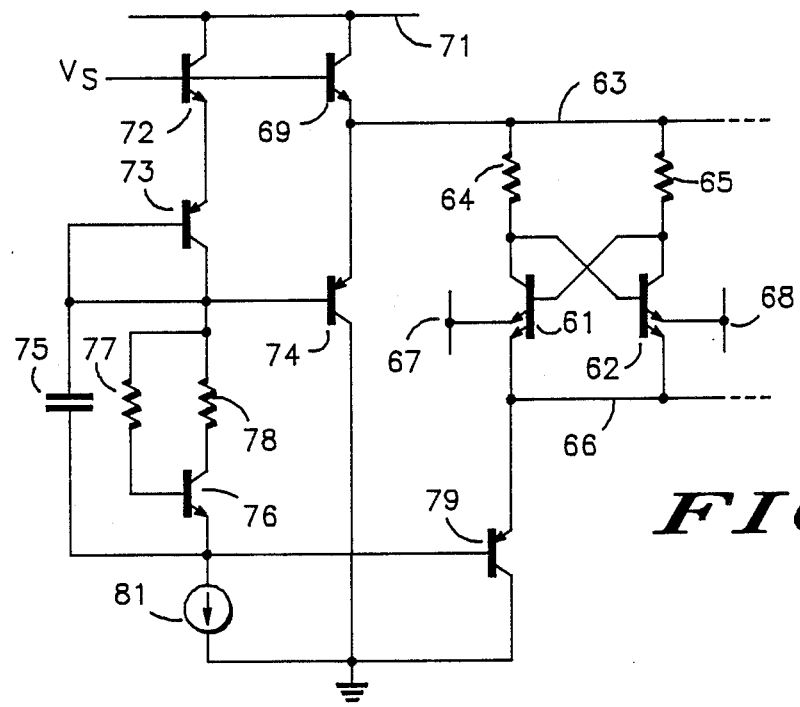
FIG. 4 is a schematic of a second embodiment of the present invention.

Referring to FIG. 4, a second embodiment of the present invention comprises a pair of cross-coupled multi-emitter transistors 61, 62 having their collectors cross-coupled to each others base and coupled to row select line 63 by resistors 64, 65, respectively. A first emitter of each transistor 61, 62 is connected to stand-by current drain line 66. A second emitter of transistor 61 is connected to bit line 67 and a second emitter of transistor 62 is connected to bit line 68. As with the memory cell described in FIG. 3 and discussed above, this memory cell of FIG. 4 may be any type of memory cell and will be connected to a column select line as well. Further, in actuality a plurality of memory cells is connected between select line 63 and current drain line 66. This plurality of memory cells is reflected by dotted lines for row select line 63 and current drain line 66.

NPN row driver transistor 69 has an emitter connected to row select line 63, a collector connected to reference voltage line 71, and a base adapted to receive select signal $V_S$. NPN transistor 72 has its collector connected to reference voltage line 71 and its base adapted to receive select signal $V_S$. The emitter of transistor 72 is connected to the emitter of PNP transistor 73. Both the base and collector of transistor 73 are connected to the base of PNP transistor 74, one terminal of capacitor 75, and are coupled to the base and collector of NPN transistor 76 by resistors 77, 78, respectively. The emitter of transistor 76 is connected to the other terminal of capacitor 75, the base of PNP transistor 79, and is coupled to ground by current source 81. The collectors of transistors 74, 79 are connected to ground. Transistor 76 and resistors 77, 78 comprise a half cell and will draw a substantially similar current to that of the memory cell comprising transistors 61, 62 and resistors 64, 65. Transistors 73, 79 are matched and will also draw a substantially similar current to each other.

When a negative, or downward transition, select signal $V_S$ is applied to the bases of transistors 69, 72, they will turn off. Current source 81 will pull-down the bases of transistors 73, 74, 79. Transistor 79 will then remove any charge from the memory cell through the standby current drain line 66. Transistor 74 assists by removing any charge appearing on select line 63. Transistors 74, 79 are PNP's and will multiply any current drawn therethrough by beta, thereby improving the rate of discharge.

By now it should be appreciated that there has been provided an improved AC transient driver for memory cells. This transient driver removes inherent stored capacitance charge from the memory cells, without an increased power requirement.

We claim:

1. A memory circuit comprising:
a first supply voltage terminal;
a second supply voltage terminal;
a selection line;
a current drain line;
a plurality of memory cells coupled between said selection line and said current drain line;
first means coupled between said first supply voltage terminal and said selection line and coupled for receiving a select signal for providing current to said plurality of memory cells;
a first PNP transistor having an emitter coupled to said current drain line and a collector coupled to said second supply voltage terminal; and
second means coupled between said first and second supply voltage terminal and coupled to receive said select signal for biasing a base of said first PNP transistor.

2. The circuit according to claim 1 wherein said second means comprises:

third means coupled to said base of said first PNP transistor for setting the level of current drained from said plurality of memory cells; and fourth means coupled between said first supply voltage terminal and said third means and coupled for receiving said select signal and for providing current to said third means.

3. The circuit according to claim 2 wherein said third means comprises:

a second PNP transistor having a base and a collector coupled to said base of said first PNP transistor; and fifth means coupled between said fourth means and an emitter of said second PNP transistor for establishing a resistive load substantially similar to one of said plurality of memory cells.

4. The circuit according to claim 1 wherein said circuit further includes a second PNP transistor having an emitter coupled to said select line, a collector coupled to said second supply voltage terminal, and a base coupled to said second means.

5. The circuit according to claim 4 wherein said second means further comprises means coupled to a base of both said first and second PNP transistors for setting the level of current in said first and second PNP transistors.

6. An improved memory circuit coupled to receive a select signal having a first and a second state, including first and second supply voltage terminals and having a plurality of memory cells coupled between a select line and a current drain line, means coupled between said first supply voltage terminal and said select line for providing current to said select line when said select signal is in said first state, the improvement comprising:

a first PNP transistor having an emitter coupled to said current drain line and a collector coupled to said second supply voltage terminal, for drawing stored charge from said plurality of memory cells when said select signal transitions to said second state; and means coupled to a base of said first PNP transistor and between said first and second voltage terminals and responsive to said select signal for setting the current level in said first PNP transistor.

7. The improved memory circuit according to claim 6 wherein said improvement further comprises a second PNP transistor having an emitter coupled to said select line, a collector coupled to said second supply voltage terminal, and a base coupled to said current level setting means.

* * * * *